United States Patent
Lee et al.

[11] Patent Number: 6,044,017
[45] Date of Patent: Mar. 28, 2000

[54] FLASH MEMORY DEVICE

[75] Inventors: Dong-gi Lee, Kyunggi-do; Tae-sung Jung, Seoul, both of Rep. of Korea

[73] Assignee: Samsung Electronics, Co., Ltd., Suwon, Rep. of Korea

[21] Appl. No.: 09/082,297

[22] Filed: May 19, 1998

[30] Foreign Application Priority Data

May 19, 1997 [KR] Rep. of Korea ............... 97-19239

[51] Int. Cl.⁷ .................................................. C11C 16/04
[52] U.S. Cl. ........................ 365/185.18; 365/185.11; 365/185.26
[58] Field of Search ................. 365/185.18, 185.11, 365/185.26

[56] References Cited

U.S. PATENT DOCUMENTS

| | | | |
|---|---|---|---|
| 5,671,176 | 9/1997 | Jang et al. | 365/185.18 |
| 5,828,600 | 10/1998 | Kato et al. | 365/185.11 |
| 5,877,980 | 3/1999 | Mang et al. | 368/185.17 |

Primary Examiner—David Nelms
Assistant Examiner—Van Thu Nguyen
Attorney, Agent, or Firm—Marger Johnson & McCollom, P.C.

[57] ABSTRACT

A flash memory includes an array of memory cells having sources, drains, floating gates, and control gates. The array includes a conductive plate formed over the memory cells to affect a capacitive coupling between the memory cells and the conductive plate. A first voltage source provides a first voltage to the control gate of a selected one of the memory cells. A second voltage source provides a second voltage to the conductive plate after the control gate of the selected one of the memory cells has been charged up to a predetermined voltage level. Additionally, the flash memory includes a switching circuit to transfer the first and second voltages to the control gate of the selected memory cell and the conductive plate, respectively, responsive to a first and second control signals.

12 Claims, 15 Drawing Sheets

FLASH MEMORY DEVICE

BACKGROUND OF THE INVENTION

1. Field of the Invention

The invention relates to a nonvolatile memory device having Electrically Erasable and Programmable Read Only Memory (EEPROM) cells and, more specifically, to a flash EEPROM device employing cell plates within a cell array structure thereof.

2. Description of the Related Art

Flash EEPROMs (hereinafter flash memory) typically require high voltages for erasing and programming data stored in a memory cell. The data is erased and programmed by a tunnel effect induced by the application of the high voltage to the memory cell and occurs between a floating gate and a substrate. The high voltages required are generally over ten volts that may hurt thin and weak oxide layers for isolating the floating gates and substrate. The high voltages may result in a degradation of reliability with the memory cell and device malfunction due to the destruction of the memory cell. An optimized correlation between the high voltage level requirements and the stability of the memory cell in a flash memory allows successful erasing and programming operations with lower voltage levels.

A recent technique for lowering the high voltage requirement was disclosed in an article published in the 1996 Symposium of VLSI Technology, entitled *A Novel Booster Plate Technology In High Density NAND Flash Memories For Voltage Scaling-Down And Zero Program Disturbance*. The memory cell disclosed in the above-entitled article is shown in FIG. 1B as an equivalent circuit for coupling capacitance. A nominal floating gate transistor (or floating gate memory cell) having a control gate, a floating gate, and source and drain regions is shown in FIG. 1A.

In the nominal floating gate transistor shown in FIG. 1A, stray capacitors Cb, Cd, and Cf are connected between the control gate and floating gate, between the floating gate and channel region, and between the floating gate and source/drain regions, respectively. With the above-described capacitive construction, the voltage at the floating gate Vfg is given by Equation 1 when a programming voltage Vpgm is applied to the control gate.

EQUATION 1

$$Vfg = Vpgm \times Cb(Cb+Cd+2Cf)$$

During programming, charges are injected into the floating gate from the channel region through an oxide layer therebetween if the floating gate voltage Vfg becomes higher than a critical voltage. The injected charges cause a tunnel effect such as Fowler-Nordheim (FN) tunneling thereby increasing a threshold voltage of the memory cell to be programmed. At this time, the ratio of the floating gate voltage Vfg to the programming voltage Vpgm, i.e., the coupling ratio γc during programming is equal to Cb/(Cb+Cd+2Cf). As shown in FIGS. 1A and 2, a booster plate is formed over the control gates. The booster plate extends along the direction of word lines and is arranged in parallel to the direction of bit lines. Because of this, more stray capacitors for coupling, such as Ca, Cc and Cp, are added to those capacitive factors included in Equation 1. The capacitors Ca, Cc, and Cp are interposed between the booster plate and the control gate, the floating gate and substrate and the booster plate and the source/drain regions, respectively.

During programming, the booster plate receives a voltage through a word line in addition to the application of the programming voltage Vpgm to the control gate. The coupling ratios of the floating gate to the booster plate γw and the floating gate to the control gate γp become Cb/(Cb+2Cc+Cd+2Cf) and 2Cc/(Cb+2Cc+Cd+2Cf), respectively. Thus, the coupling ratio of the floating gate for the programming voltage Vpgm and booster plate voltage γc(p) is given by Equation 2.

EQUATION 2

$$\gamma c(p) = (Cb+2Cc)/(Cb+2Cc+Cd+2Cf)$$

Comparing Equation 2 to the former Equation 1 results in the flash memory cell having the booster plate having a greater coupling ratio than that of the normal flash memory. The greater coupling ratio results in a lower level of the programming voltage Vpgm. Thus, a flash memory having the memory cell shown in FIG. 1B can be programmed using a lower level programming voltage Vpgm than that of the normal flash memory cell. The larger coupling capacity is also useful for inhibiting programming by preventing unselected memory cells from being disturbed by self-boosting while a selected memory cell is being programmed.

FIG. 3 shows configurations of voltages applied to the booster plate memory cell during programming in a NAND-type flash memory. During the voltage setting period, the pass voltage Vpass applied to unselected memory cells, the program voltage Vpgm and program transfer voltage Vpgm_w1 are linearly increased towards their predetermined potentials. The program transfer voltage Vpgm_w1 is a voltage applied to a gate of the transfer MOSFET connecting the program voltage Vpgm to a selected word line that is coupled to the control gate and booster plate of a selected memory cell. Therefore, the program transfer voltage Vpgm_w1 must be higher than the program voltage Vpgm by the threshold voltage Vth of the transfer MOSFET so as to supply the program voltage Vpgm to the selected word line without a voltage drop. The pass voltage Vpass is lower than the program voltage Vpgm as usual. Once the programming period begins, the program voltage Vpgm is applied to a selected word line and the booster plate, the program transfer voltage Vpgm_w1 is applied to a gate of the transfer transistor corresponding to the selected word line, and the pass voltage Vpass is applied to unselected word lines thereby supplying a bias voltage to the drain of the selected memory cell from a corresponding bit line.

The above-described structure in which a voltage is applied to the booster plate has encountered some problems. First, although the booster plate contributes to reducing the voltage level of the programming voltage Vpgm. It does so at the expense of time. The time for charging and discharging the booster plate is lengthened during programming because of the booster plate's capacitance about 20 times that of a wordline thereby increasing current dissipated therein. Another problem is leakage current between cell strings (or NAND cell units), for which the programming voltage Vpgm is being connected to the booster plate. Leakage current occurs because the booster plate covers plural cell strings adjacent each other. The leakage current may cause operational stability of the memory. Furthermore, the high booster plate voltage repeatedly applied thereto every programming cycle degrades the reliability of the insulation layer between the booster plate and floating gate. The degradation of the insulation layer in turn disables the programming operation or causes a programmed cell to be put in a lightly-erased state in which the threshold voltage of the programmed cell to be far from the desired profile and is closer to the erasure profile region.

SUMMARY OF THE INVENTION

Accordingly, it is an object of the present invention to provide a flash memory having a booster plate capable of accomplishing a reliable program operation.

It is another object of the present invention to provide a flash memory having a booster plate capable of accomplishing a reliable program operation with a lower booster plate voltage.

It is yet another object of the present invention to provide a flash memory having a booster plate capable of reducing power consumption during a programming operation even with a booster plate.

It is yet another object of the present invention to provide a NAND-typed flash memory having a booster plate capable of an advanced program operation with an enhanced programming efficiency.

In order to accomplish the above-described objects, the flash memory of the invention includes an array of memory cells having sources, drains, floating gates, and control gates, the array including a conductive plate formed over the memory cells for capacitively coupling the memory cells to the conductive plate; a first voltage source coupled to the control gate of the selected memory cell; and a second voltage source coupled to the conductive plate for providing a second voltage to the conductive plate after the control gate of the selected memory cell reaches a predetermined voltage level.

The flash memory includes a switching circuit coupled to the first and second voltage sources for respectively providing the first and second voltages to the control gate of the selected memory cell and the conductive plate in response to a first and second control signals. The flash memory further includes a third voltage source coupled to unselected memory cells for providing a third voltage to the control gates of the unselected memory cells responsive to the first control signal. The array of memory cells is optionally divided into a plurality of memory blocks, the memory blocks being coupled to a plurality of word lines, the flash memory including a plurality of drive lines connected to the word lines through corresponding transfer transistors therebetween; a block decoder to control the transfer transistors; and a section decoder coupled to the drive lines, the section decoder respectively providing the first, second, and third voltages to a selected one of the plurality of word lines, the conductive plate, and unselected word lines of the plurality of word lines; wherein the second voltage is provided to the conductive plate after the first voltage is transferred to the selected word line.

The invention includes a method for reducing capacitive coupling between an array of memory cells and a booster plate formed over the array. The method comprises selecting a memory cell from the array of memory cells; providing a program voltage to a control gate of the selected memory cell; and providing a booster plate voltage to the booster plate after the control gate of the selected memory cell reaches a predetermined voltage.

The method includes providing a pass voltage to control gates of unselected memory cells and setting the control gates of the selected and unselected memory cells in a floating state after the control gate of the selected memory cell reaches the predetermined voltage and before the booster plate voltage is provided to the booster plate. Providing the program voltage to the control gate of the selected memory cell includes providing the program voltage responsive to a first control signal, providing the booster plate voltage to the booster plate includes providing the booster plate voltage responsive to a second control signal, and providing the pass voltage to the control gates of unselected memory cells includes providing the pass voltage to the control gates of unselected memory cells responsive to the first control signal.

BRIEF DESCRIPTION OF THE DRAWINGS

The foregoing and other objects, features, and advantages of the present invention will become more readily apparent from the following detailed description of a preferred embodiment that proceeds with reference to the following drawings.

In the figures, like reference numerals denote like or corresponding parts. The prefix n before a signal name indicates that the signal is enabled at a logic low level.

DETAILED DESCRIPTION OF THE PREFERRED EMBODIMENTS

1. The First Embodiment

Figure 1A:
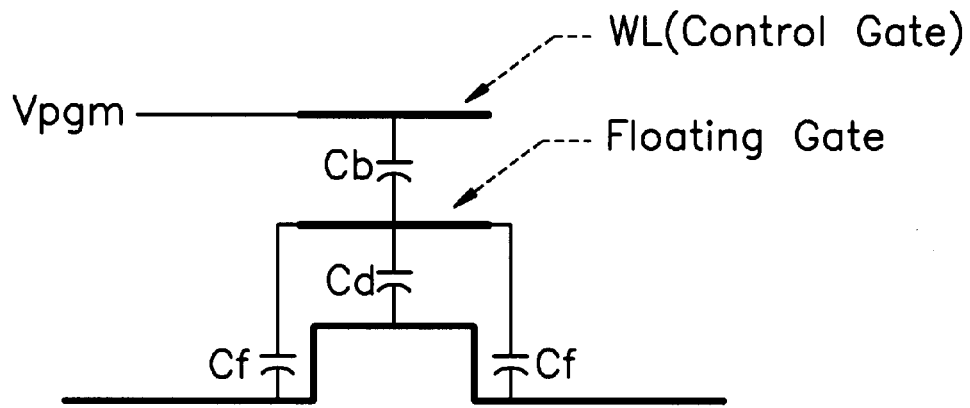
FIG. 1A is an equivalent circuit of the capacitance found in the structure of a typical flash EEPROM cell.
Figure 1B:
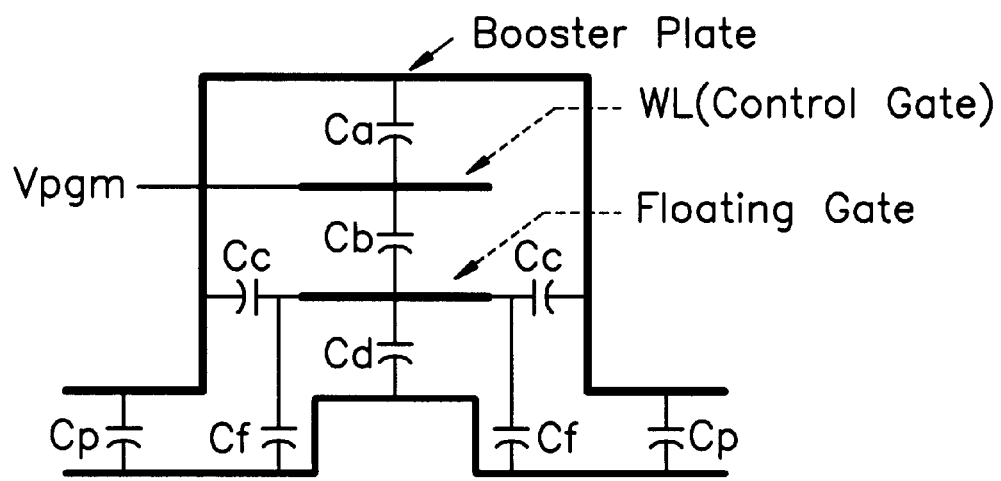
FIG. 1B is an equivalent circuit of the capacitance found in the structure of a plate-structured flash EEPROM cell.
Figure 2:
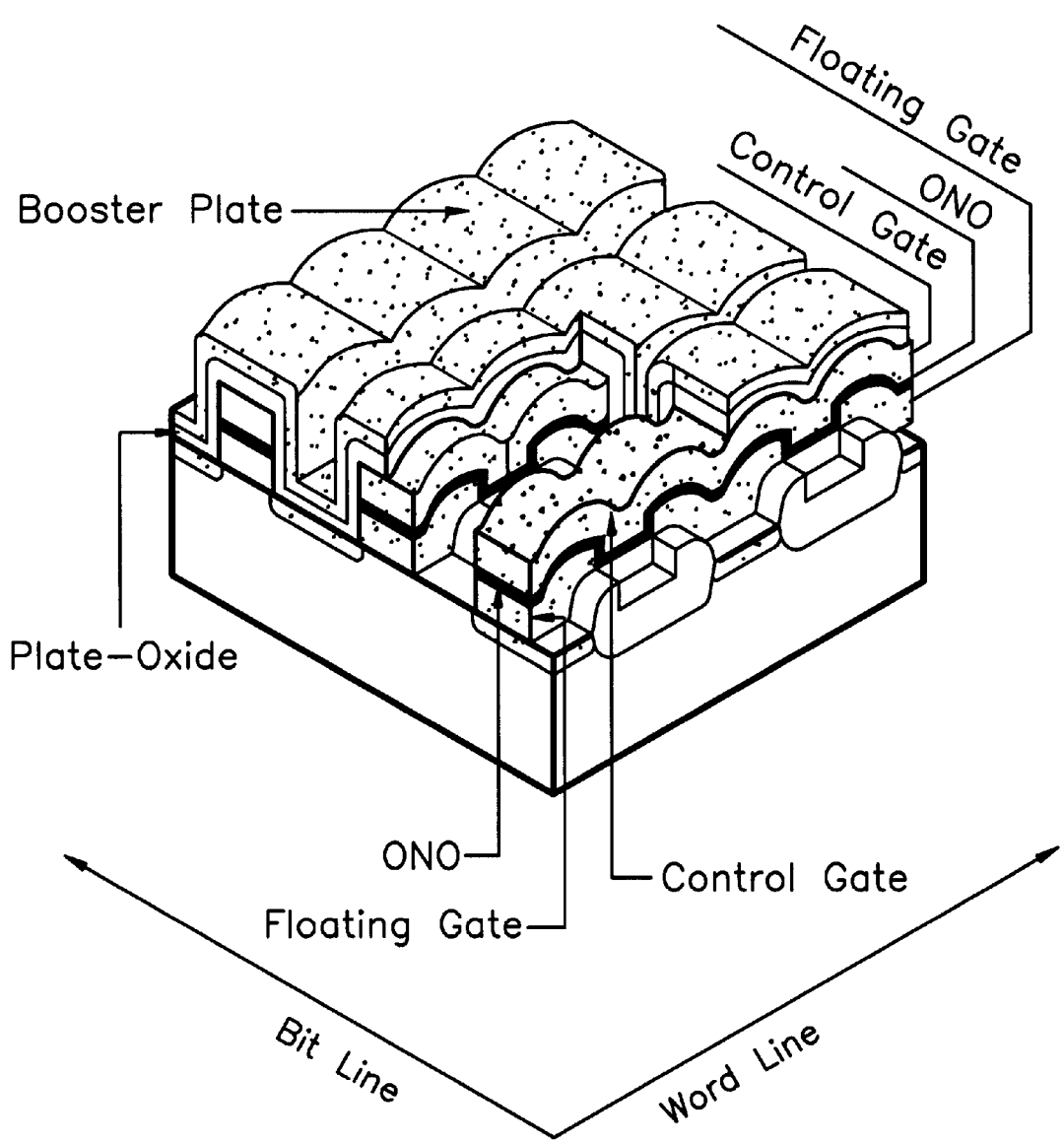
FIG. 2 is a perspective view of the plate-structured flash EEPROM cell shown in FIG. 1B.
Figure 3:
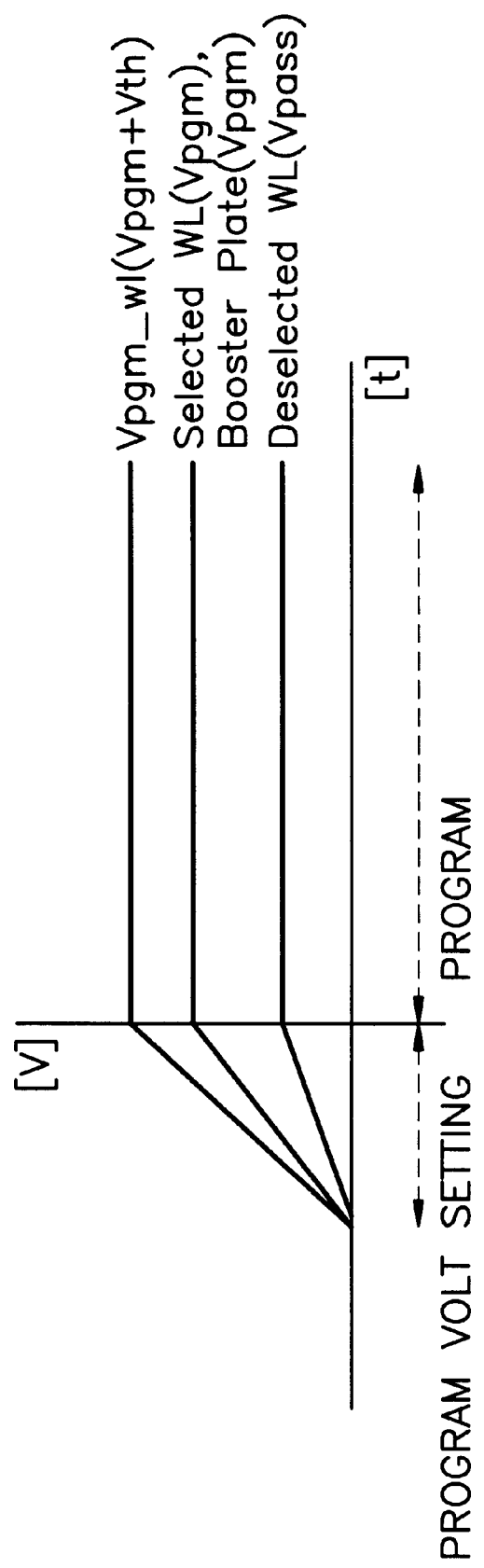
FIG. 3 is a waveform diagram of the voltages used during the typical programming operation.
Figure 4:
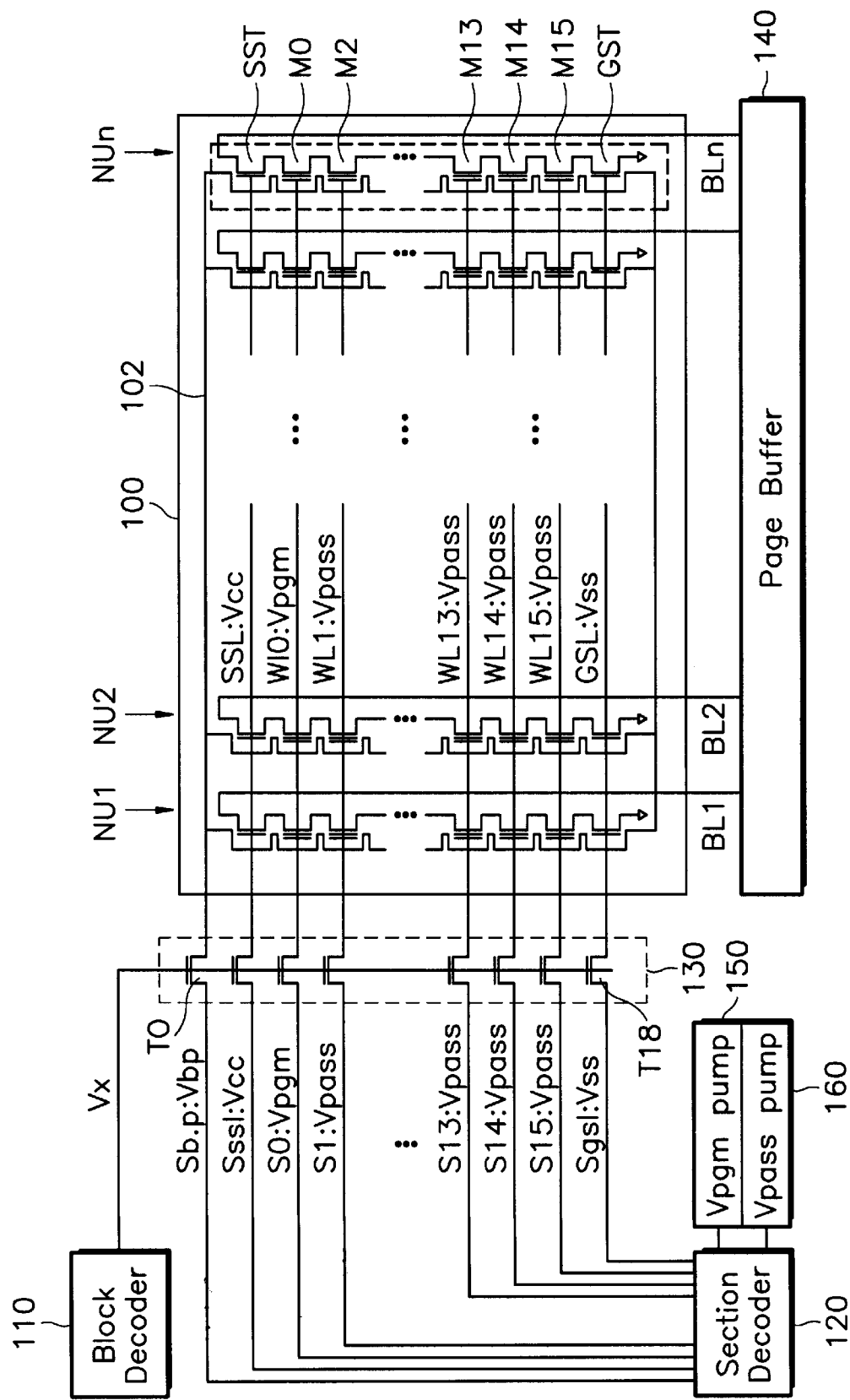
FIG. 4 is a circuit diagram of a NAND-type flash EEPROM according to a first embodiment of the present invention.

FIG. 4 is a circuit diagram of a NAND-type flash memory. The flash memory shown in FIG. 4 includes an array block 100 comprising a plurality of NAND cell units NU1~Nun, each NAND cell unit having a booster plate 102. Each of the cell units NU1~NUn has a string selection transistor SST connected to a bit line, a ground selection transistor GST connected to ground, and plural floating gate cell transistors M0~M15 connected between the string and ground selection transistors. A booster plate 102 extends to the cell units covering the selection and cell transistors. Gates of the string and ground selection transistors are commonly connected to string and ground selection lines SSL and GSL, respectively. Groups of control gates of the cell transistors are each connected to word lines WL0~WL15. The structure of the cell transistor covered by booster plate 102 is the same shown in FIG. 2. Bit lines BL0~BLn are each coupled to the cell units and to the page buffer 140.

Booster plate 102, string selection transistor SST, cell transistors M0~M15, and ground selection transistor GST are connected to outputs of section decoder 120 each through transfer transistors T0~T18 of switch circuit 130. Gates of transfer transistors T0~T18 are commonly connected gate drive voltage Vx for transferring drive signals Sbp, Sss1, S0~S15, and Sgs1 all generated from section decoder 120 to booster plate 102, string selection line SSL, word lines WL0~WL15, and ground selection line GSL, respectively. Section decoder 120 receives program voltage Vpgm and pass voltage Vpass from the program voltage pump 150 and the pass voltage pump 160, respectively. The voltages marked on the booster plate and signal lines will be explained later with reference to the program operation. It should be understood that the memory block and decoders shown in FIG. 4 may correspond to a part of the whole memory array in the flash memory which has a plurality of memory blocks.

Figure 5:
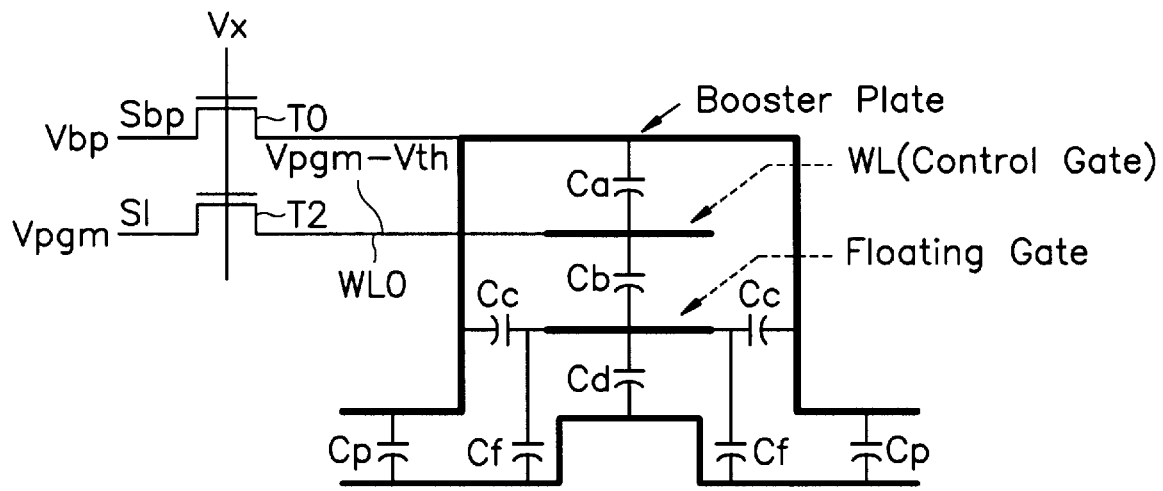
FIG. 5 is an equivalent circuit diagram of the connection of the capacitances in the flash EEPROM cell and transfer transistors shown in FIG. 4.

FIG. 5 is an equivalent configuration of capacitances in the flash EEPROM cell and transfer transistors shown in FIG. 4. FIG. 4 will be used to explain the voltage boosting mechanism in a selected cell transistor by capacitive coupling. The gate drive voltage Vx generated from block decoder 110 is applied to gates of the transfer transistors T0 to T18 and booster plate voltage Vbp and program voltage Vpgm are respectively applied to booster plate 102 and word line WL0 (a selected word line) through transistors T0 and T2. The selected word line WL0 is charged up to a voltage equal to Vpgm−Vth (referred to as Vw1; Vth is threshold voltage of the transfer transistor T2 corresponding to the selected wordline WL0). After a predetermined time, the booster plate is pulled up to a voltage Vbp causing the voltage level of WL0 to be increased over voltage Vw1 (Vpgm−Vth) by capacitor Ca between the booster plate and control gate. The voltage increase from voltage Vw1 is referred to voltage Vw1* (Vw1* is greater than Vw1). The increased voltage Vw1* is due to the capacitive coupling of Ca that lowers the gate-to-source voltage Vgs of T2 thereby turning off transistor T2.

Thus, the floating gate voltage Vfg is formed of a voltage coupled by the voltages Vw1*, Vfg1, and a voltage Vfg2 coupled by the voltage Vbp applied to the booster plate, as follows:

EQUATION 3

$$Vfg1 = Vw1^* \times Cb(Cb + 2Cc + Cd + 2Cf)$$

$$Vfg2 = Vbp \times (C1 + 2Cc)/(C1 + 2Cc + Cd + 2Cf)$$

EQUATION 4

$$Vfg = Vfg1 + Vfg2$$

where $C1 = (Ca \times Cb)/(Ca + Cb)$.

While the programming operation is being carried out in the aforementioned manner in which the booster plate and selected word line receive a same voltage level, the coupling ratio of a selected cell transistor (or selected memory cell) may be summarized as follows:

EQUATION 5

$$\text{coupling ratio} = \gamma c^*(\text{plate}) = Cb/(Cb + 2Cc + Cd + 2Cf) + (C1 + 2Cc)/(Cb + 2Cc + Cd + 2Cf)$$

Figure 6:
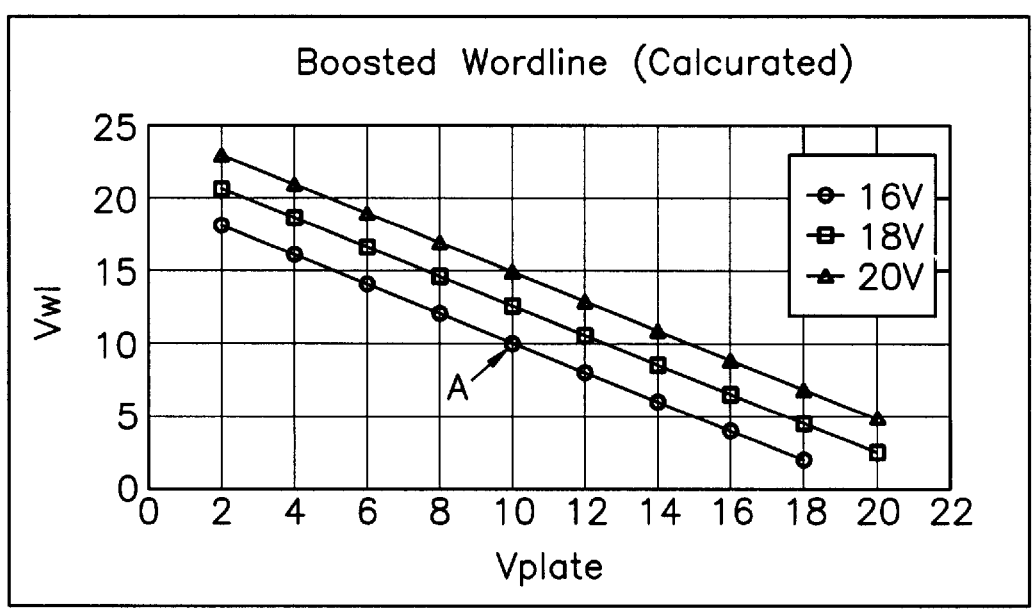
FIG. 6 is a waveform diagram comparing the voltages for a word line and a booster plate of the present invention with that of the conventional art.

Comparing the coupling ratio of $\gamma c^*$ of Equation 5 with the coupling ratio $\gamma c$ ($=(Cb+2Cc)/(Cb+2Cc+Cd+2Cf)$) of Equation 2, the coupling ratio $\gamma c^*$ is greater than the coupling ratio $\gamma c$ by the value of $C1/(Cb+2Cc+Cd+2Cf)$. In a typical case where substantial values of the capacitance are applied to the equations of the coupling ratios, $\gamma c^*$ is 1.08 while $\gamma c$ is 0.67. The enhanced coupling ratio makes it possible to accomplish the program operation even with reduced voltage levels supplied to the selected word line and the booster plate. The program operation in the prior art memory requires voltage levels higher than those required in the present invention. FIG. 6 compares the voltage levels required in the prior art and present memory, plotting numeric results produced from matching the voltage values of the prior art into those of the present. Referring to FIG. 6, assuming that voltage levels applied to a selected word line and a booster plate are the same in the prior art and present invention, a voltage applied to a selected word line and a booster plate 7 16V to the prior art memory corresponds to 10V applied to the present invention memory (at point A). The present voltage levels for the selected word line and booster plate are lower than the conventional voltage levels by about 6V during programming.

Figure 7:
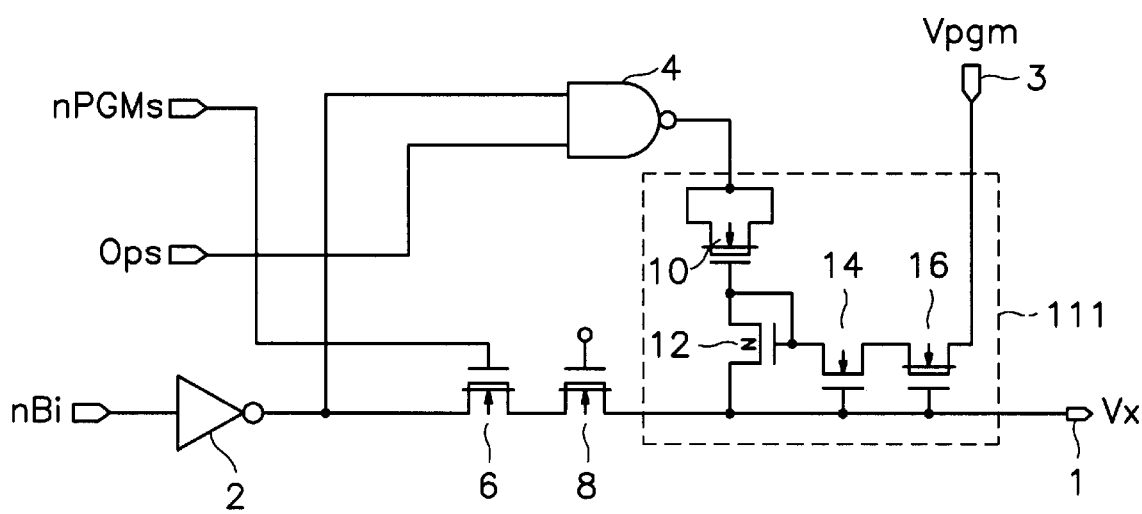
FIG. 7 is a circuit diagram of the block decoder shown in FIG. 4.
Figure 8:
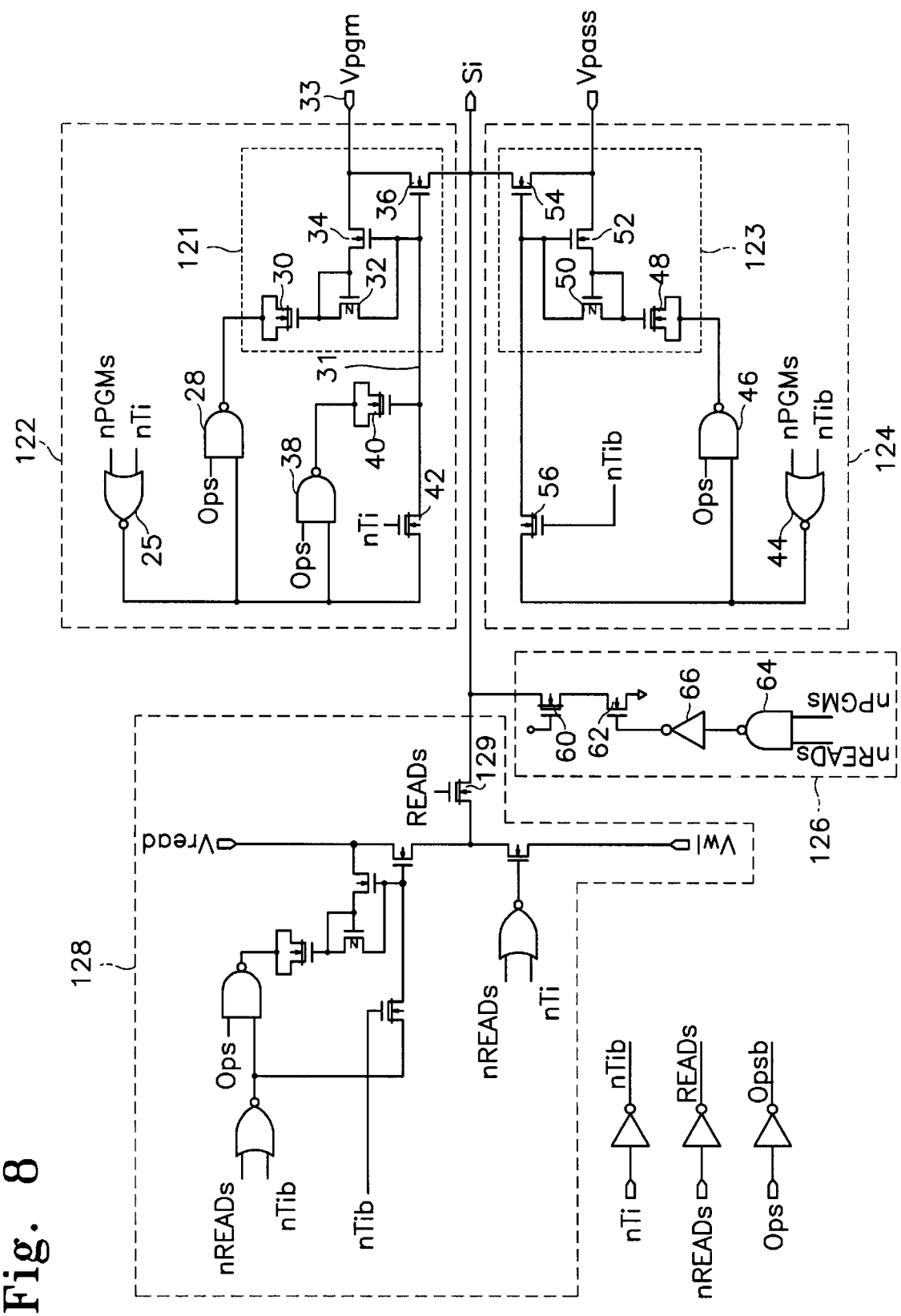
FIG. 8 is a circuit diagram of the section decoder shown in FIG. 4.
Figure 9:
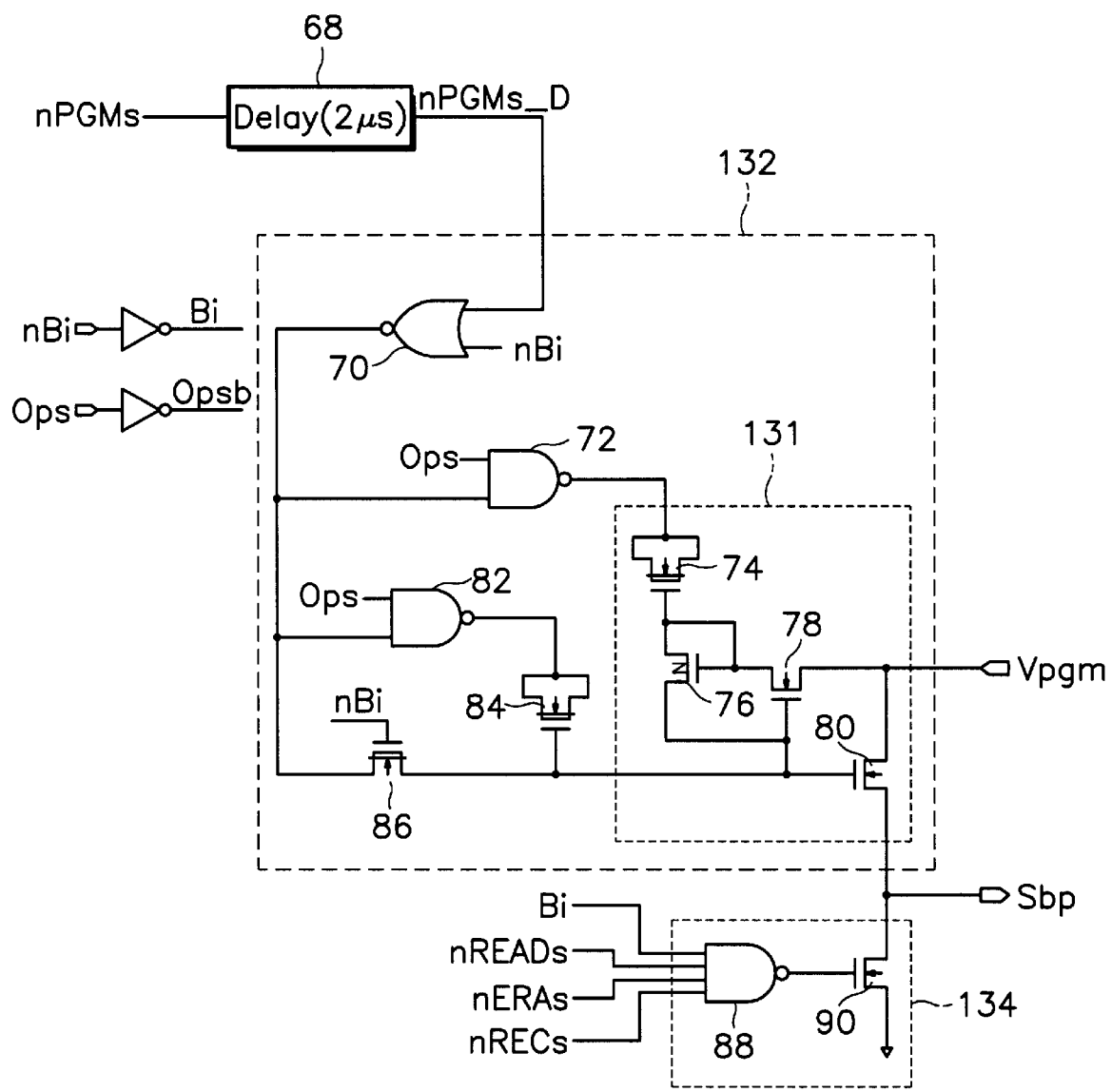
FIG. 9 is a drive circuit for the booster plate according to the first embodiment of the present invention.

FIGS. 7 through 9, detail the circuits of block decoder 110, a portion of section decoder 120, and booster plate drive circuit, respectively. Referring to FIG. 7, block selection signal nBi is connected to output terminal 1 from which output voltage Vx (equal to Vw1) is generated through inverter 2 and NMOS depletion transistors 6 and 8. Block selection signal nBi is applied to the input of NAND gate 4 together with oscillating signal Ops. The gates of transistors 6 and 8 are coupled to program signal nPGMs and a power supply voltage, respectively. The output of NAND gate 4 is applied to the depletion MOS capacitor 10 of switch pump 111 in which capacitor 10 is connected to output voltage Vx through diode-coupled NMOS transistor 12. The gate of NMOS transistor 12 is connected to program voltage Vpgm through NMOS transistor 14 and NMOS depletion transistor 16. The gates of transistors 14 and 16 are coupled to output terminal 1. If the output of NAND gate 4 is applied to capacitor 10 responsive to oscillating signal Ops while the block selection signal nBi is at a logic low level (to select the corresponding memory block), the voltage of the gate and drain of transistor 12 are charged up to a pumped voltage level by capacitor 10. The stepwise increasing drain voltage of transistor 12 is transferred to the gates of transistors 14 and 16 that connect the program voltage Vpgm to the gate and drain of transistor 12. By repetitively pumping the voltage Vx as described above, the input voltage Vx increases to the program voltage Vpgm.

The circuit shown in FIG. 8 corresponds to one unit in the section decoder 120 used to decode a word line drive signal Si for one word line. The section decoder 120 includes other units such as that shown in FIG. 8 constructed with the same structure. The circuit of the section decoder 120 is formed of three portions of drive circuits 122, 124 and 128, and discharging circuit 126. Drive circuits 122 and 124 provide the program voltage Vpgm and the pass voltage Vpass to the drive signal Si, respectively, during the program operation. Drive circuit 128 is used during the read operation. Drive circuit 128 does not affect the program operation because its connection to the drive signal Si switches off. However, during the read operation, the drive circuit 128 drives the drive signal Si because the read signal READs is at a logic high level thereby turning on NMOS depletion transistor 129. The drive circuit 128 is not a critical aspect of the present invention. Therefore, the description of its operation is abbreviated.

In the drive circuit 122, switch pump 121 connects the program voltage Vpgm to the drive signal Si responsive to the output of the NAND gate 28, The NAND gate 28 receives oscillating signal Ops together with the output of the NOR gate 25 that, in turn, receives the signals nPGMs and nTi. The signal nTi is generated from decoding address signals and activated at a logic low level when a corresponding one of the word lines is selected during programming. Switch pump 121 comprises NMOS transistor 36 connected between the program voltage Vpgm and the drive signal Si, depletion MOS capacitor 30, one electrode of which is coupled to the output of the NAND gate 28, diode-coupled NMOS transistor 32 connected between the other electrode of the capacitor 30 and the gate of transistor 36, and NMOS transistor 34 connected between the gate of transistor 32 and the program voltage Vpgm. The gate of transistor 34 is coupled to the gate of transistor 36 and connected to the output of the NAND gate 38 through the depletion MOS capacitor 40, and connected to the output of NOR gate 25 through the NMOS depletion transistor 42 whose gate is coupled to the signal nTi. Drive circuit 122 is activated in a program operation when the programming signal nPGMs is at a logic low level and thereby the output of the NOR gate 25 is set to a logic high level such that the program voltage Vpgm is supplied to a selected word line through the word line drive signal Si.

Drive circuit 123 supplies the pass voltage Vpass to a corresponding word line through the drive signal Si that is not selected during the program operation. Therein, switch pump 123 connects the pass voltage Vpass to the drive signal Si in response to the output of NAND gate 46. NAND gate 46 receives the oscillating signal Ops together with the output of NOR gate 44 that, in turn, receives the signals nPGMs and Ti (a complementary signal of signal nTi; Ti is high while nTi is low). Switch pump 123 comprises NMOS transistor 54 connected between the pass voltage Vpass and the drive signal Si, depletion MOS capacitor 48 one electrode of which is coupled to the output of NAND gate 46, diode-coupled NMOS transistor 50 connected between the other electrode of capacitor 48 and the gate of transistor 54, and NMOS transistor 52 connected between the gate of transistor 50 and the pass voltage Vpass. The gate of transistor 52 is coupled to the gate of transistor 54 and connected to the output of NOR gate 44 through NMOS depletion transistor 56 whose gate is coupled to the signal Ti.

Drive circuits 122 and 123 alternatively conduct in accordance with the word line drive signal Si corresponding, in turn, to a selected word line in the program mode. The selection of a word line to be programmed is synchronized with the logic level of signal nTi (or Ti) which determines the activation of the drive circuit while the program signal nPGMs is at a logic low level for programming. Thus, a logic low level signal nTi activates the drive circuit 122 supplying the program voltage Vpgm to the drive signal Si while the drive circuit 124 is being shut off by a logic high signal Ti. A logic high signal Ti activates the drive circuit 124 supplying the pass voltage Vpass to the drive signal Si while drive circuit 122 is turned off by a logic high level signal nTi.

The discharging circuit 126 includes NMOS depletion transistors 60 and 62 connected between the drive signal Si and a ground voltage Vcs. The gate of transistor 60 is coupled to a power source voltage and the gate of transistor 62 is coupled to the output of NAND gate 64 through inverter 66. NAND gate 64 receives the signals nPGMs and nREADs. Transistor 62 connects the drive signal Si to ground potential thereby pulling down the voltage level of the word line drive signal (or line) Si to the ground voltage when the signals nPGMs and nREADs are at logic high levels for which a program operation or a read operation is not enabled.

The booster plate drive circuit shown in FIG. 9 is disposed in the section decoder 120. Referring to FIG. 9, the booster plate drive circuit includes delay circuit 68, voltage drive circuit 132, and discharging circuit 134. In voltage drive circuit 132, switch pump 131 connects the program voltage Vpgm to the booster plate drive signal (or line) Sbp in response to the output of NAND gate 72. NAND gate 72 receives oscillating signal Ops together with the output of NOR gate 70, in turn, receiving delayed program signal nPGMs_D generated from delay circuit 68. Switch pump 131 comprises NMOS transistor 80 connected between the program voltage Vpgm and the signal Sbp, depletion MOS capacitor 74, one electrode of which is coupled to the output of NAND gate 72, diode-coupled NMOS transistor 76 connected between the other electrode of capacitor 74 and the gate of transistor 80, and NMOS transistor 78 connected between the gate of transistor 76 and the program voltage Vpgm. The gate of transistor 78 is coupled to the gate of transistor 76 and connected to the output of the NAND gate 82 through depletion MOS capacitor 84, and connected to the output of the NOR gate 70 through NMOS depletion transistor 86 whose gate is coupled to block selection signal nBi. The block selection signal nBi is generated from decoding address signals to select a memory block and is activated at a logic low level when a corresponding one of memory blocks is selected while programming. The discharging circuit 134 utilizes NMOS transistor 90 that is connected between the booster plate signal Sbp and a ground potential. The gate of transistor 90 responds to the output of NAND gate 88 that receives the signal Bi (the complementary signal of nBi), nREADs, nERAs and nRECs.

The voltage drive circuit 132 activates a predetermined time, e.g., 2 microseconds, after the program signal nPGMs is at a logic low level thereby setting the output of the NOR gate 70 to a logic high level such that the program voltage Vpgm is supplied to a selected booster plate through the signal Sbp. Transistor 90 of the discharging circuit 134 turns on when at least one of the input signals of the NAND gate 88 becomes low, i.e., the time of discharging is determined when the corresponding memory block is not selected even while programming or when the current operation is not the programming operation.

Figure 10:
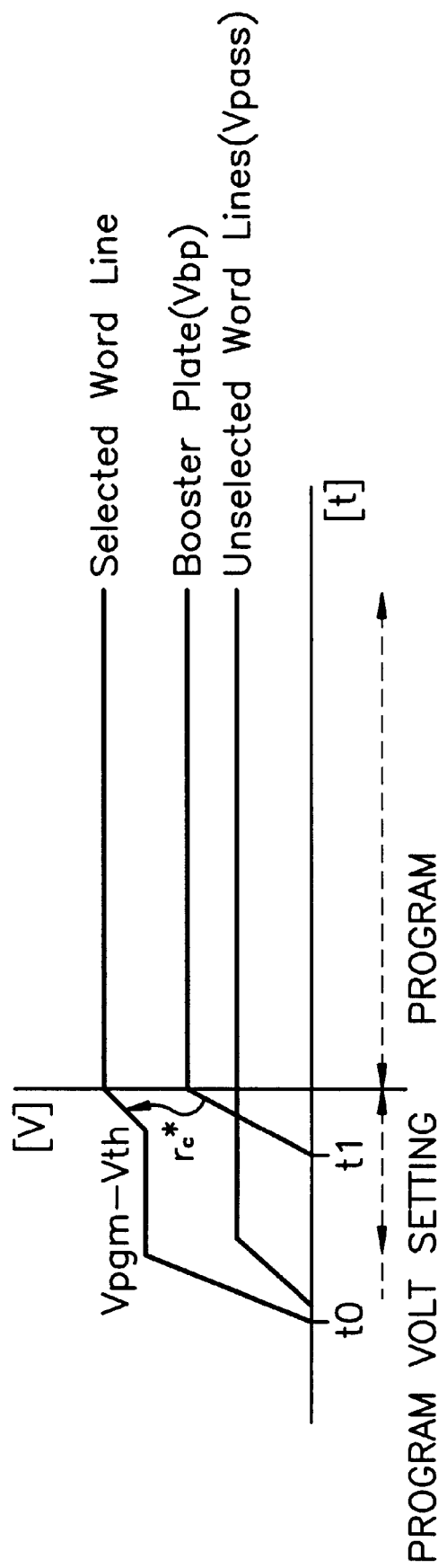
FIG. 10 is a waveform diagram of the voltages applied to a selected word line, unselected word lines, and a booster plate during the programming operation according to the first embodiment of the present invention.

The programming operation is as follows. The programming operation with the booster plate begins with the voltages of the drive signals generated from the block decoder and section decoder, referring to FIGS. 4 and 10. It is assumed that the selected word line is WL0.

During the program voltage set-up period from time t0, the program voltage Vpgm for the selected word line WL0 is supplied from section decoder 120 through the corresponding drive signal S0 while the pass voltage Vpass is applied to the unselected word lines WL1~WL15 through their drive signals S1~S15. The drive signals Sss1 and Sgs1 for the string and ground selection lines have the levels of Vcc and Vss, respectively. The program voltage Vpgm transmitted through the corresponding transfer transistor T2 is converted into the voltage difference Vpgm−Vth that is the substantial level applied to the wordline WL0 until time t1. From time t1, lapsing 2 microseconds from t0, the 2 microseconds being established by the delay circuit 68 of the booster plate drive circuit, the booster plate voltage Vbp thereby causing a capacitive coupling. This capacitive coupling has the ratio $\gamma c^*$ of the Equation 5 resulting in boosting the voltage level of the selected word line from the voltage difference Vpgm−Vth. During the program period, the self-boosted word line voltage is higher than Vpgm−Vth contributing to programming the cell transistor M0 selected while the unselected word lines are still held at a pass voltage Vpass. The selected word line traces the potential of the self-boosted voltage accompanying the floating gate voltage Vfg shown in Equation 4. Accordingly, electrons are moved to the floating gate by Fowler-Nordheim tunneling and the selected memory cell has a higher threshold voltage in a programmed state.

2. The Second Embodiment

Figure 11:
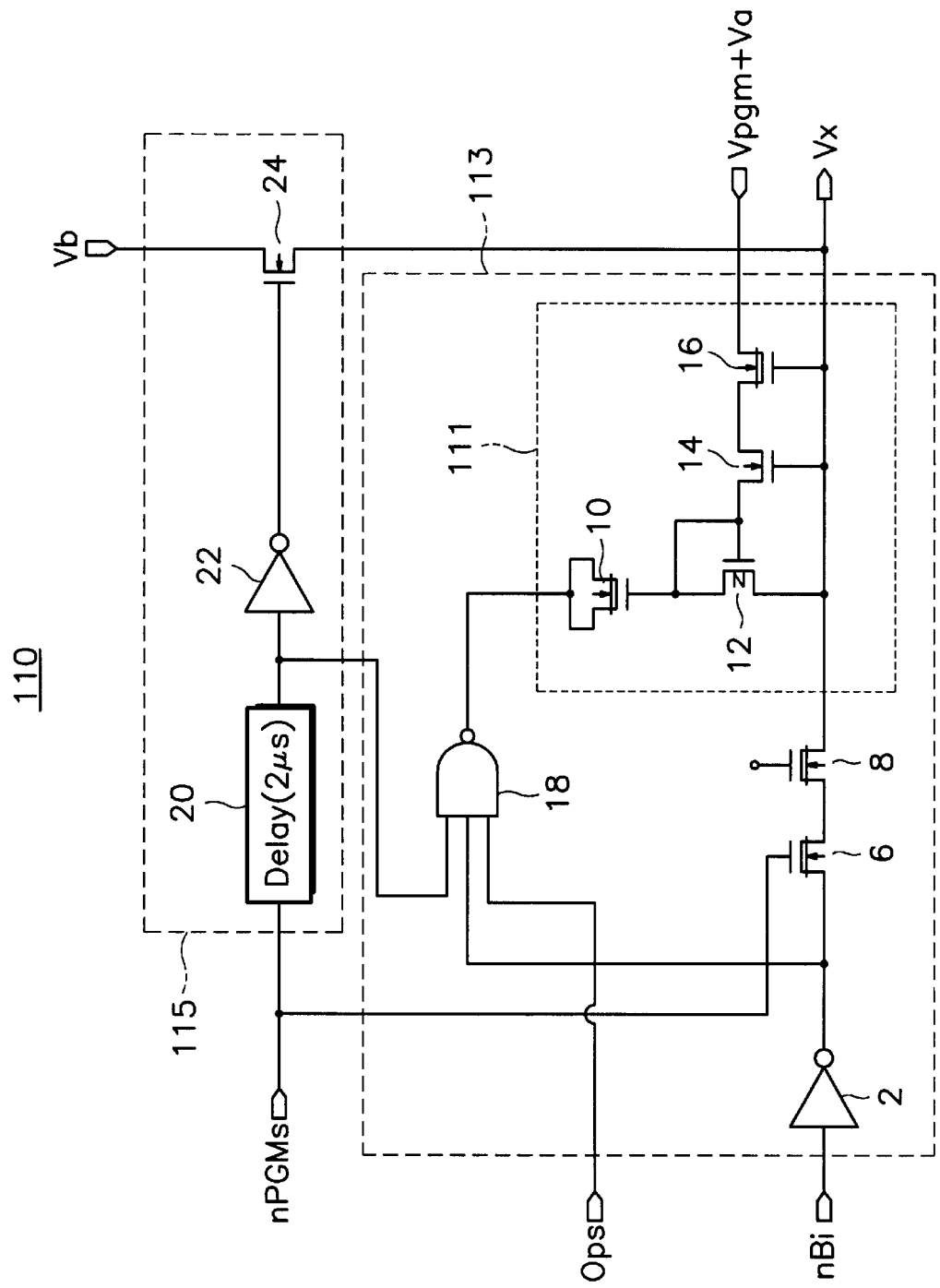
FIG. 11 is a circuit diagram of the block decoder shown in FIG. 4 according to a second embodiment of the present invention.

Another available circuit of the block decoder 110 for controlling the transfer transistors T0~T18 of FIG. 4 is shown in FIG. 11 as a second embodiment of the present invention. The circuit shown in FIG. 11 includes a portion that is different from the first embodiment. Same circuit elements in FIG. 11 have the same reference numerals as those shown in FIG. 7. The block decoder of FIG. 11 comprises two drive circuits 113 and 115, in order to accomplish an efficient control of the transfer transistors. Drive circuit 113 has switch pump 111 in which the gate of the NMOS transistor 12 is connected to capacitor 10 and the voltage source Vpgm+Va (a voltage higher than Vpgm) through the channels of NMOS transistor 14 and NMOS depletion transistor 16. The capacitor 10 of switch pump 111 is coupled to the output of the NAND gate 18 which inputs oscillating signal Ops, an inverted signal nBi, and a delayed version of signal (for instance, about 2 microseconds) nPGMs. The inverted signal nBi is coupled to output voltage Vx that is also coupled to the gates of the transistors 14 and 16, through the NMOS depletion transistors 6 and 8 whose gates are each coupled to signals nPGMs and Vcc, respectively. The drive circuit 115 includes a delay circuit 20 generating the delayed version of signal nPGMs by about 2 microseconds, and the NMOS transistor 24 connected between voltage sources Vb and Vx. The gate of the NMOS transistor 24 is connected to an inverted version of the delayed signal generated from the delay circuit 20. The voltage Vb is between the voltage applied to the booster plate and the voltage applied to the selected word line WL0.

Figure 12:
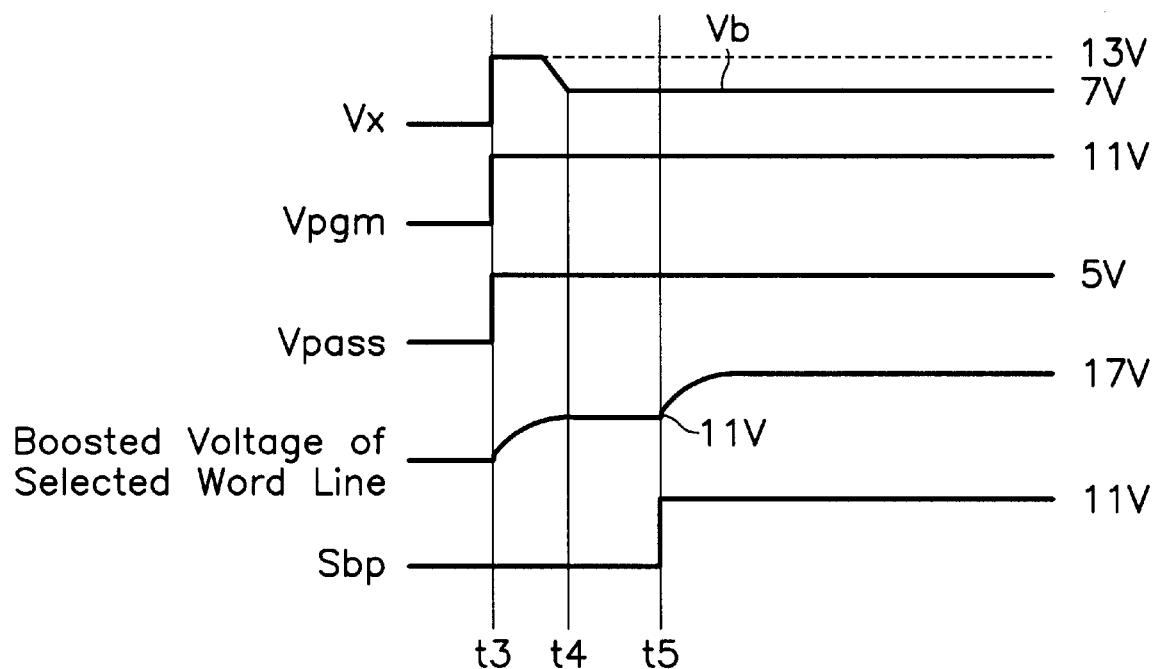
FIG. 12 is a timing diagram of the voltages applied to word lines, a booster plate, and transfer transistors during the programming operation according to the second embodiment of the present invention.

FIG. 12 shows a timing diagram of the programming operation with the block decoder of FIG. 11. At t3, the block decoder generates the voltage Vx having a level equal to 13V, i.e., Vpgm+Va, as an initial voltage level. The program voltage Vpgm, having a level equal to 11V, is applied to a corresponding driveline of a selected word line while the pass voltage Vpass (5V) is applied to the unselected word lines. The voltage Vpgm+Va equal to 13V secures a full transfer of the program voltage Vpgm to the selected word line. Then, the selected word line is pulled up to 11V of the program voltage Vpgm through a corresponding transfer transistor (e.g., T2 for M0). After lapsing the delayed time of about 2 microseconds from t3, the voltage Vx goes to the level of Vb, e.g., 7V, at t4, for which the output of delay circuit 20 responding to a logic low programming signal nPGMs after the delayed time causes the output of the NAND gate 18 to be held at a high level setting the switch pump 111 into a null state. In the meantime, the transistor 24 switches on so as to transfer a voltage vb of 7V to voltage Vx. This transition of Vx from 13V to 7V turns off the corresponding transfer transistor thereby causing the selected word line to be in a floating state. Moreover, after completing the transfer of the program voltage Vpgm to the selected word line, there is no need for maintaining the voltage Vpgm+Va of 13V because the efficient program voltage Vpgm was already transferred to the selected word line from about 2 microseconds from t3. The predetermined delay time may be specified in the limit of at least securing a stable application of the program voltage Vpgm to the selected word line. Thereafter, if the booster plate voltage of 11V is applied to the booster plate 102 from the booster plate drive circuit in the section decoder 120 shown in FIG. 4, the current voltage level of the selected word line is then pulled up to about 17V at t5 by the capacitive coupling between the booster plate and control gate coupled to the selected word line. In this case, the floating gate voltage Vfg induced therein accords to Equation 4.

3. The Third Embodiment

Figure 13:
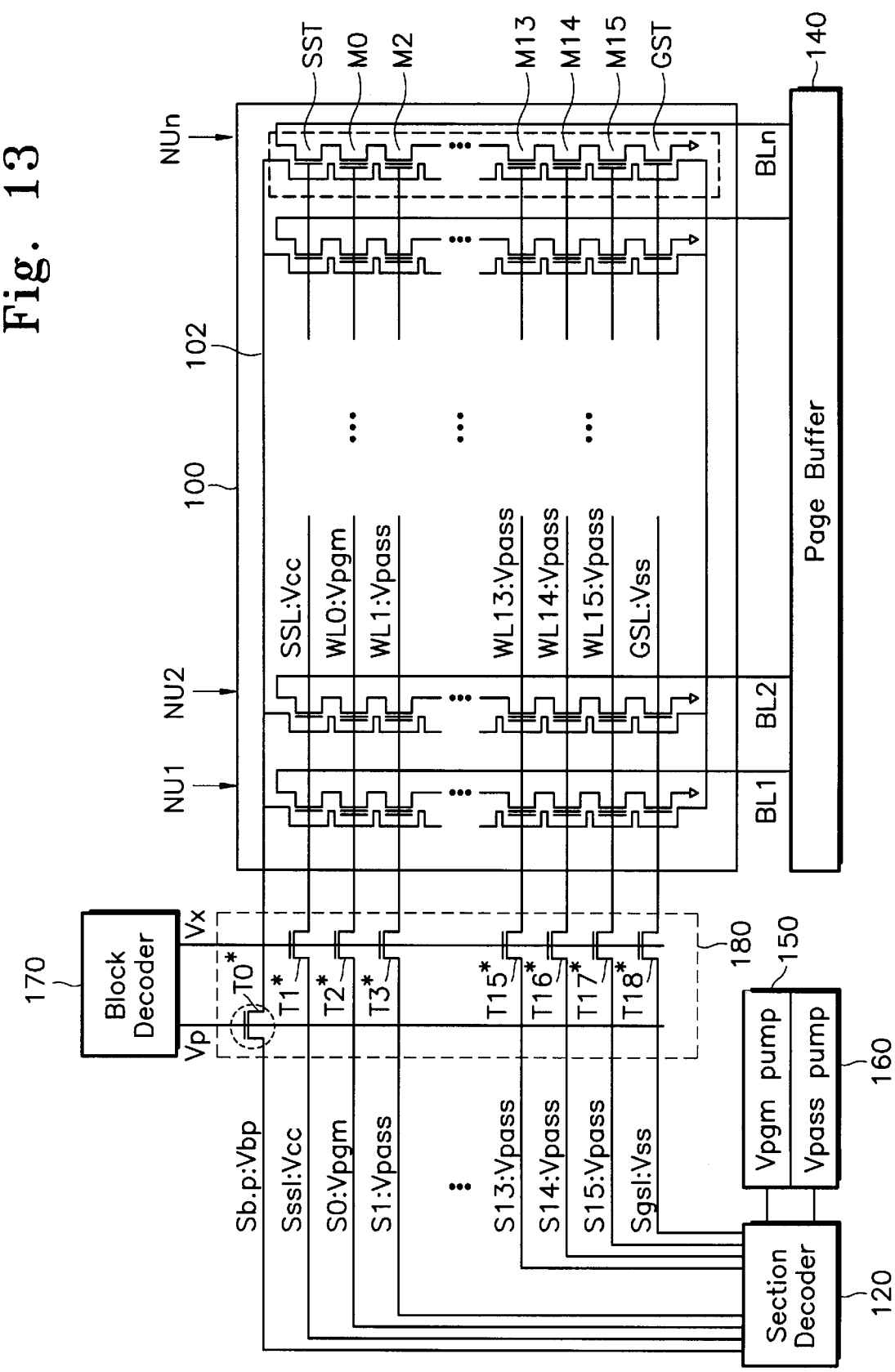
FIG. 13 is a circuit diagram of a NAND-type flash EEPROM according to a third embodiment of the present invention.

FIG. 13 shows a NAND-typed flash EEPROM according to a third embodiment of the present invention in which block decoder 170 generates, as well as the output voltage Vx, the voltage Vp that is applied only to the gate of the transfer transistor T0* of switching circuit 180. While the output voltage Vx is applied to the other transfer transistors T1 through T18 each connected between drive lines Sss1 through Sgs1 and string selection lines SSL through ground selection lines GSL. The transfer transistor T0* is connected between the booster plate driveline Sbp and booster plate 102. The transfer transistor T0* may be provided to every memory block and block decoder 170 has two kinds of voltage drive circuits, one each for voltages Vp and Vx as disclosed in FIGS. 14A and 14B. The other features of the circuit in FIG. 13 are the same as those of FIG. 4.

Figure 14A:
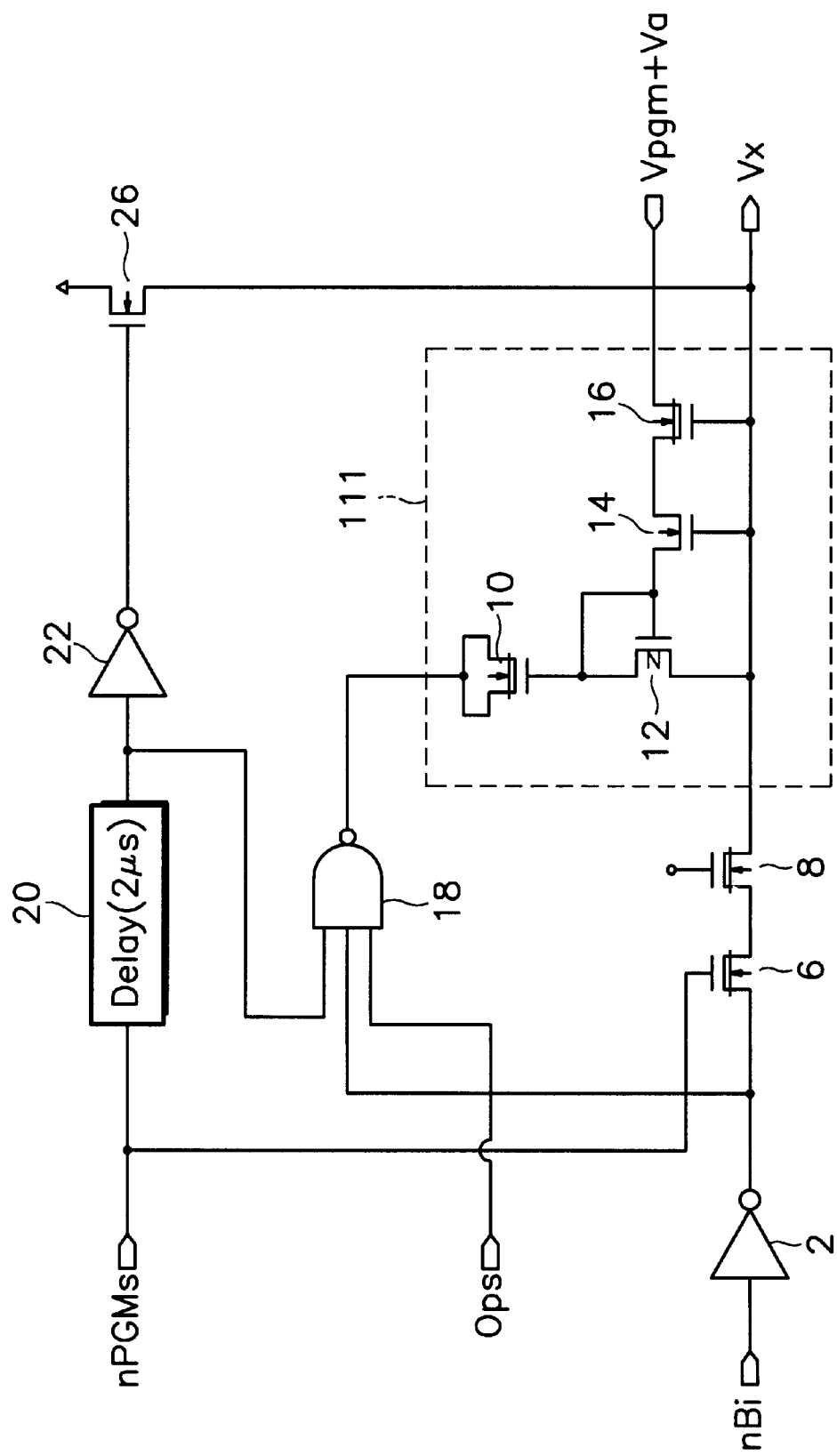
FIGS. 14A and 14B are diagrams of various circuits for the block decoder shown in FIG. 13.

Referring to FIG. 14A, a drive circuit generating voltage Vx applied to the gates of the transfer transistors T1 through T18 in common is the same as the circuit of FIG. 11 with the exception of transistor 26. The gate of the transistor 26 is coupled to an inverted and delayed version of the programming signal nPGMs connected between ground potential and Vx.

Figure 14B:
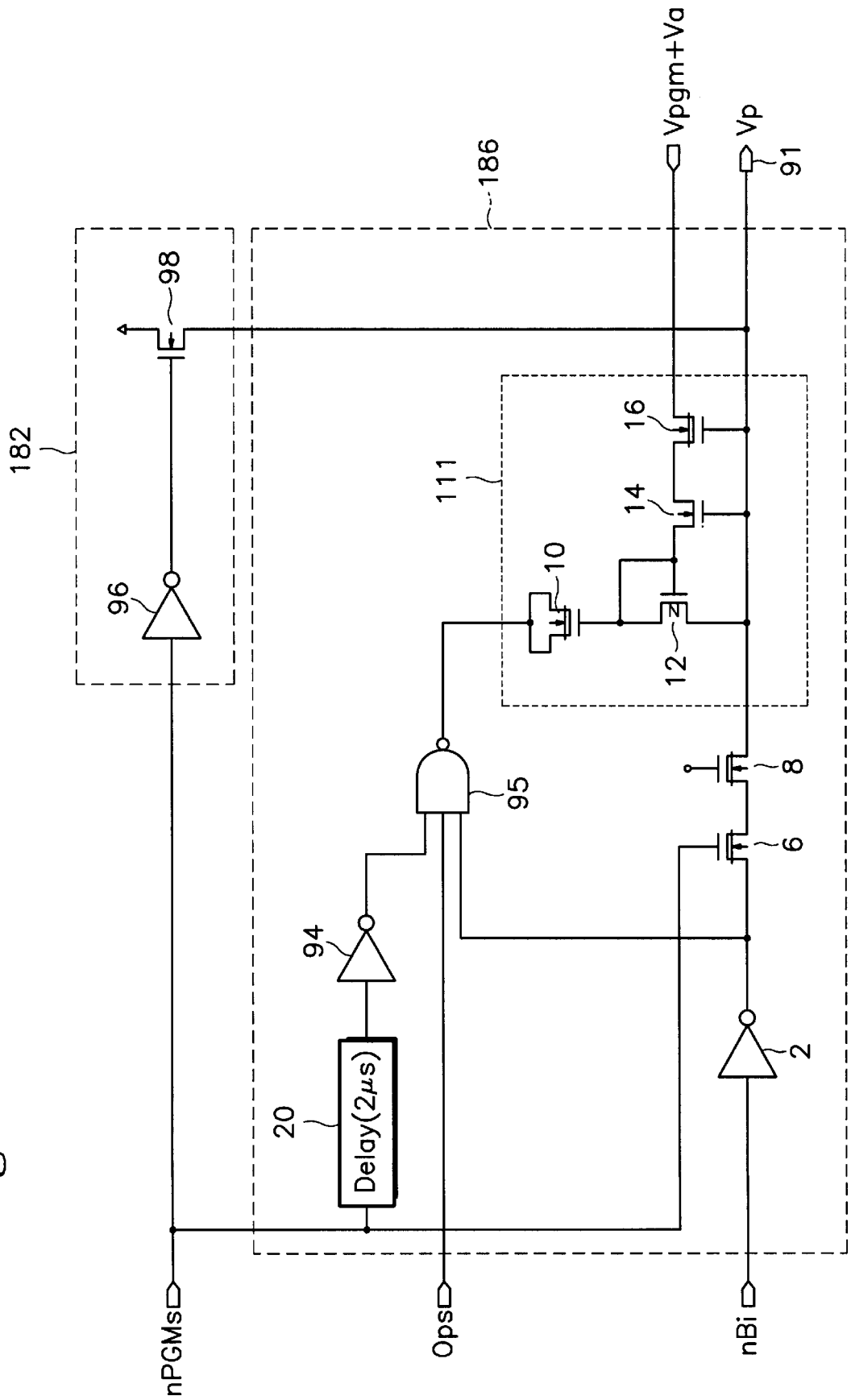

Referring to FIG. 14B, a circuit generating voltage Vp applied to the gate of transfer transistor T0* includes drive circuits 182 and 186. Drive circuit 182 has inverter responding to the programming signal nPGMs and NMOS transistor 98 connecting the output voltage Vx to ground potential in response to output of inverter 96. In drive circuit 186, the programming signal nPGMs is applied to the input of NAND gate 95 through delay circuit 20 and inverter 94, together with the oscillating signal Ops and the inverted signal nBi. The output of the NAND gate 95 is applied to capacitor 10 of switch pump 111 which has the same construction as that of FIGS. 11 and 14B.

Figure 15:
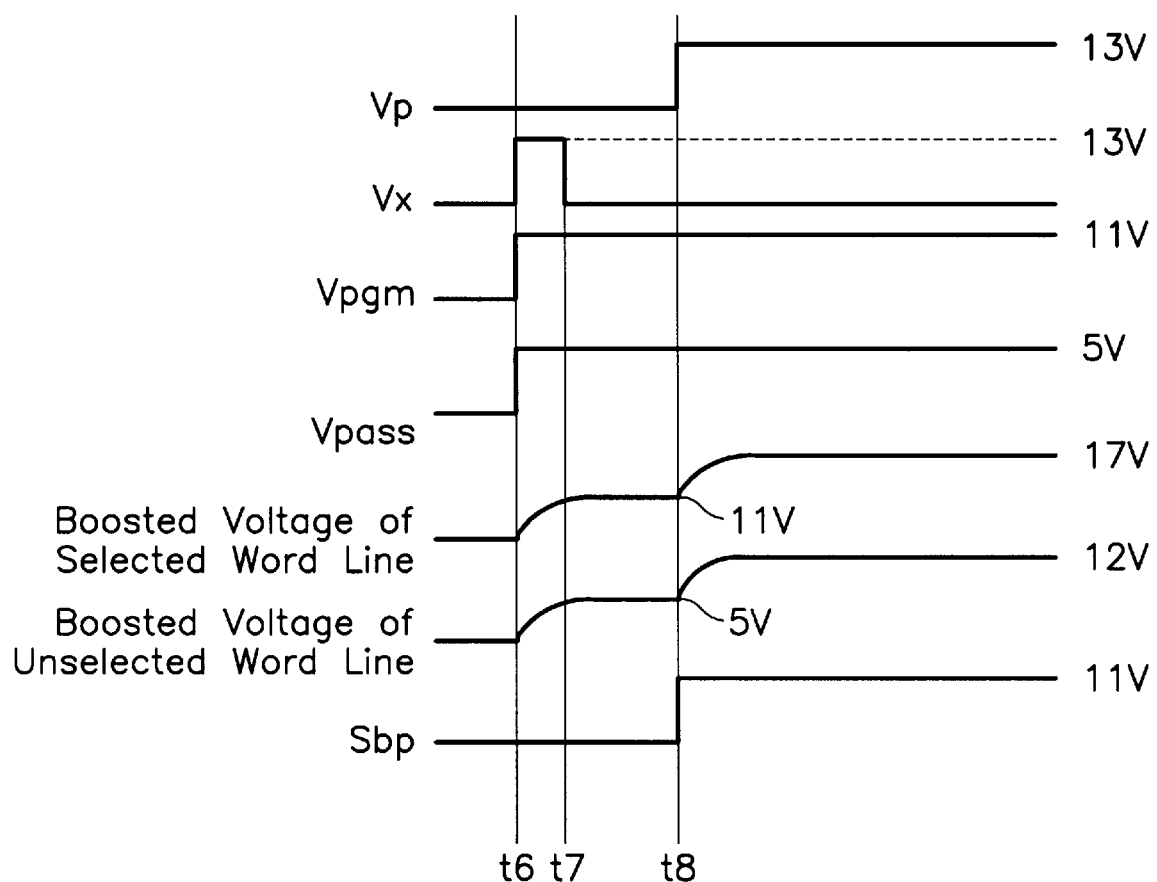
FIG. 15 is a timing diagram of the voltages applied to word lines, a booster plate, and transfer transistors during the programming operation according to the third embodiment of the present invention.

The programming operation according to the third embodiment will be described hereinafter in conjunction with the timing chart of FIG. 15. When the programming mode initiates, the programming signal nPGMs changes to a low level causing the program voltage Vpgm of 11V and the pass voltage Vpass of 5V to be generated each from the charge pumps 150 and 160. NAND gate 18 activates the switch pump 111 because the delayed signal nPGMs (nPGMs_D) and the inverted signal nBi are at logic high levels while the oscillating signal Ops is oscillating between high and low. Thus, at t6, the voltage Vx goes to the voltage Vpgm+Va of about 13V that is applied to the gates of transfer transistors T1 through T18 so as to connect the drive lines Sss1 through Sgs1 to SSL through GSL as shown in FIG. 13. During this time, the voltage Vp is held at ground potential because the signal nPGMs is at a logic low level turning transistor 98 on through inverter 96.

After the predetermined delay time of about 2 microseconds lapses from t6, the delayed signal nPGMs causes transistor 26 (FIG. 14A) to connect the current voltage Vx at t7 to ground potential disabling the switch pump 111 (FIG. 14A). The voltage Vx falls down to ground potential to turn the transfer transistors off causing all of the word lines to be in a floating state. Thereafter, at t8, if the booster plate voltage of 11V is applied to the booster plate 102 from the booster plate drive circuit in the section decoder 120, the current voltage level of the selected word line is then pulled up to about 17V by the capacitive coupling between the booster plate and the selected word lines. The unselected word lines are also affected by the capacitive coupling, their voltage being boosted up to the level of about 12V which reduces the level of the pass voltage Vpass.

As described above, the voltage applied to the booster plate is activated a predetermined time after the programming voltage has been applied to the selected word line. The resulting voltage of the selected word line increases to a level higher than the voltage level applied thereto, timely providing a self-boosting by a capacitive coupling mechanism. It is possible to accomplish a reliable programming operation even with a lower booster plate voltage which reduces the harshness against memory cells due to an excessive high voltage lasting for a long time in the programming operation.

The timely sequential application with the program voltage and booster plate voltage enhances the value of the coupling ratio at the floating gate so as to amplify the effective electric field during the programming operation. Further, the enhanced coupling ratio shortens the charge and discharge time of the booster plate with a capacitance greater than any other conductive lines in the memory thereby reducing the current consumption dissipated during the programming operation.

Moreover, as seen in the third embodiment, since the unselected word lines are held at the pass voltage Vpass, a lower Vpass may be enough to set the unselected word lines and memory cells into stable pass states for the selected word line and memory cell, which also contributes to a decrease of overall power consumption.

Having described and illustrated the principles of the invention in a preferred embodiment thereof, it should be apparent that the invention can be modified in arrangement and detail without departing from such principles.

What is claimed is:

1. A flash memory, comprising:
an array of memory cells having sources, drains, floating gates and control gates, the array including a conductive plate formed over the memory cells for capacitively coupling the memory cells to the conductive plate;
a first voltage source coupled to the control gate of a selected one of the memory cells for providing a first voltage to the control gate of the selected memory cell;
a second voltage source coupled to the conductive plate for providing a second voltage to the conductive plate after the control gate of the selected memory cell reaches a predetermined voltage level; and
a switching circus coupled to the first and second voltage sources for respectively providing the first and second voltages to the control gate of the selected memory cell and the conductive plate in response to a first and second control signals;
wherein the control gates of the memory cells are in a floating state after the control gate of the selected memory cell reaches the predetermined voltage and before the second voltage is provided to the conductive plate.

2. The flash memory of claim 1 including a third voltage source coupled to unselected memory cells for providing a third voltage to the control gates of the unselected memory cells responsive to the first control signal.

3. The flash memory of claim 2 wherein the array of memory cells is divided into a plurality of memory blocks and wherein the control gates of the memory cells are in a floating state after the control gate of the selected memory cell reaches the predetermined voltage level and before the second voltage is provided to the conductive plate.

4. The flash memory of claim 3 wherein the
first control signal drives the control gates to the floating state after the control gates reach the predetermined voltage level and before the second voltage is provided to the conductive plate.

5. The flash memory of claim 2 wherein the
array of memory cells is divided into a plurality of memory blocks, the memory cells being coupled to a plurality of word lines, the flash memory including:
a plurality of drive lines connected to the word lines through corresponding transfer transistors therebetween;
a block decoder to control the transfer transistors; and
a section decoder coupled to the drive lines, the section decoder respectively providing the first, second, and third voltages to a selected one of the plurality of word lines, the conductive plate, and unselected word lines of the plurality of word lines;
wherein the second voltage is provided to the conductive plate after the first voltage is transferred to the selected word line.

6. A flash memory, comprising:
an array of memory cells divided into a plurality of memory blocks and having sources, drains, floating gates and control gates, the array including a conductive plate formed over the memory cells for capacitively coupling the memory cells to the conductive plate and the memory cells being coupled to a plurality of word lines;
a first voltage source coupled to the control gate of a selected one of the memory cells for providing a first voltage to the control gate of the selected memory cell;

a second voltage source coupled to the conductive plate for providing a second voltage to the conductive plate after the control gate of the selected memory cell reaches a predetermined voltage level;

a plurality of drive lines corresponding to the conductive plate and the word lines;

a switching circuit including a first transfer transistor interposed between a corresponding one of the drive lines and the conductive plate and a plurality of second transfer transistors interposed between corresponding drive lines;

a block decoder coupled to gates of the first and second transfer transistors of the switching circuit, a first output of the block decoder being coupled to the gate of the first transfer transistor and a second output of the block decoder being coupled to the gates of the plurality of second transfer transistors; and a section decoder coupled to the plurality drive lines, the section decoder respectively supplying a first voltage, a second voltage, and a third voltage to a selected one of the word lines, the conductive plate, and unselected word lines of the plurality of word lines;

wherein the second voltage is applied to the conductive plate in response to the control signal after the first and third voltages are respectively provided to the selected and unselected word lines.

7. A flash memory, comprising:

an array of memory cells having sources, drains, floating gates, and control gates;

a booster plate formed over the array of memory cells;

a program voltage means for providing a program voltage to a control gate of a selected memory cell;

a booster plate voltage means for providing a booster plate voltage to the booster plate after the control gate of the selected memory cell reaches a predetermined voltage level;

a pass voltage means for providing a pass voltage to control gates of unselected memory cells; and a switching means interposed between the program, the booster plate, and the pass voltage means;

wherein the memory cells transfer the program voltage to the selected memory cell responsive to a first control signal, the booster plate voltage to the booster plate responsive to a second control signal, and the pass voltage to the unselected memory cells responsive to the first control signal.

8. The flash memory of claim 7 wherein the first and second control signals are one control signal.

9. The flash memory of claim 7 wherein the switching means includes a plurality of transfer transistors, each transfer transistor connected to a corresponding memory cell.

10. The flash memory of claim 7 including:

a block decoder coupled to the switching means for generating the first and second control signals; and a section decoder interposed between the program and pass voltage means and the switching means for generating the program, booster plate, and the pass voltages.

11. A method for reducing capacitive coupling between an array of memory cells and a booster plate formed over the array, the method comprising:

selecting a memory cell from the array of memory cells;

providing a program voltage to a control gate of the selected memory cell responsive to a first control signal;

providing a booster plate voltage to the booster plate after the control gate of the selected memory cell reaches a predetermined voltage responsive to a second control signal; and providing a pass voltage to control gates of unselected memory cells responsive to the first control signal.

12. The method for reducing the capacitive coupling of claim 11 including setting the control gate of the selected memory cell and the control gates of unselected memory cells to a floating state after the control gate of the selected memory cell reaches the predetermined voltage and before the booster plate voltage is provided to the booster plate.

* * * * *

UNITED STATES PATENT AND TRADEMARK OFFICE
CERTIFICATE OF CORRECTION

PATENT NO. : 6,044,017
DATED : March 28, 2000
INVENTOR(S) : Lee et al.

It is certified that error appears in the above-identified patent and that said Letters Patent is hereby corrected as shown below:

Column 12,
Line 15, "switching circus" should read -- switching circuits --.

Signed and Sealed this

Twenty-first Day of May, 2002

Attest:

JAMES E. ROGAN
Attesting Officer   Director of the United States Patent and Trademark Office